United States Patent
Chang et al.

(10) Patent No.: US 6,902,961 B2
(45) Date of Patent: Jun. 7, 2005

(54) METHOD OF FORMING A CMOS THIN FILM TRANSISTOR DEVICE

(75) Inventors: Chih-Chin Chang, Hsinchu (TW); Chih-Hung Wu, Shinjuang (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 10/630,196

(22) Filed: Jul. 29, 2003

(65) Prior Publication Data

US 2004/0241919 A1 Dec. 2, 2004

(30) Foreign Application Priority Data

May 28, 2003 (TW) ......................... 92114365 A (51) Int. Cl.⁷ ..................... H01L 21/00; H01L 21/84
(52) U.S. Cl. .................. 438/149; 438/151; 438/154; 438/163; 438/164
(58) Field of Search ............................ 438/149, 151, 438/154, 163, 164

(56) References Cited

U.S. PATENT DOCUMENTS

2003/0203545 A1 * 10/2003 Hamada et al. ............. 438/149

\* cited by examiner

*Primary Examiner*—Thanh Nguyen
(74) *Attorney, Agent, or Firm*—Ladas & Parry LLP (57) ABSTRACT

A method of forming a CMOS thin film transistor device. A dry etching procedure is performed to remove part of a photoresist layer and part of a metal layer and thus forms a gate with a symmetrical cone shape and a remaining photoresist layer. The dielectric layer is thus exposed in the lightly doped area. Specially, the bottom width of the first gate is narrower than that of the first metal layer and the symmetrical cone shape is gradually thinner from bottom to top. Using the gate as a mask, an n⁻-ion implantation is performed to form a self-aligned and symmetrical LDD region in a semiconductor layer without additional photolithography steps.

20 Claims, 13 Drawing Sheets

METHOD OF FORMING A CMOS THIN FILM TRANSISTOR DEVICE

BACKGROUND OF THE INVENTION

1. Field of the Invention

The present invention relates to a process for fabricating a thin film transistor (TFT) device in a liquid crystal display (LCD) device, and more particularly, to a method of forming a complementary metal oxide semiconductor thin film transistor (CMOS TFT) device.

2. Description of the Related Art

In TFT-LCDs, a polycrystalline silicon (p-Si) TFT formed on a quartz substrate, or an amorphous silicon (a-Si) TFT formed on a glass substrate, is widely used. The TFTs in TFT-LCDs are used in one instance for a TFT matrix in a display portion and in another instance for formation of an outer circumferential circuit on a common substrate for driving said TFT matrix. In the former instance, an N-channel TFT is used, and in the latter instance, a CMOS TFT semiconductor circuit is used for achieving high speed operation.

The CMOS TFT device comprises an N-channel TFT and a P-channel TFT. Typically, the N-channel TFT has an LDD (lightly doped drain) structure in order to improve the hot electron effect, thereby decreasing leakage. A conventional method of forming the CMOS TFT device will be explained with reference to FIGS. 1A to 1E.

Figure 1A:
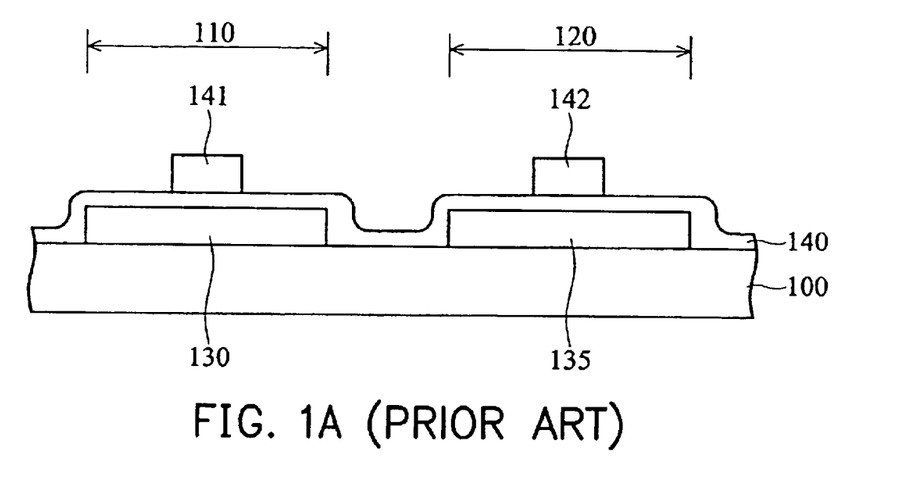
FIGS. 1A~1E are sectional views of a CMOS TFT process according to the prior art.

In FIG. 1A, a glass substrate 100 having an NMOS area 110 and a PMOS area 120 is provided. By performing a first patterning process using a first photomask, a first polysilicon island 130 and a second polysilicon island 135 are formed on the substrate 100. The first polysilicon island 130 is located in the NMOS area 110 and the second polysilicon island 135 is located in the PMOS area 120.

In FIG. 1A, a silicon oxide ($SiO_x$) layer 140 is formed over the polysilicon islands 130 and 135 and the substrate 100. A metal layer (not shown) is then formed on the silicon oxide layer 140. By performing a second patterning process using a second photomask, the metal layer (not shown) is patterned to form a first gate 141 and a second gate 142 on part of the silicon oxide layer 140. The first gate 141 is located in the NMOS area 110 and the second gate 142 is located in the PMOS area 120.

Figure 1B:
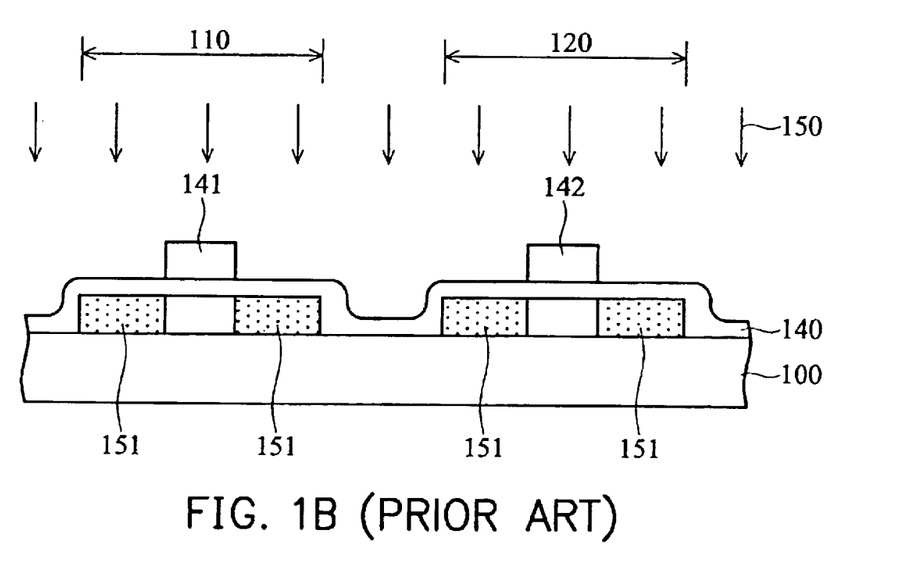

In FIG. 1B, using the first gate 141 and the second gate 142 as a mask, an $n^-$-ion implantation 150 is performed to form an $n^-$-polysilicon film 151 in part of the first polysilicon island 130 and part of the second polysilicon island 135. The $n^-$-polysilicon film 151 serves as an LDD (lightly doped drain) structure 151.

Figure 1C:
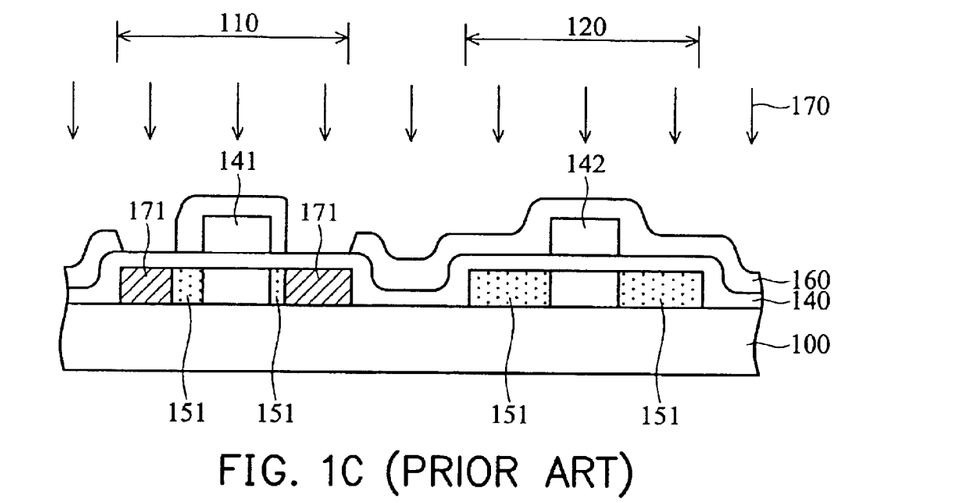

In FIG. 1C, by performing a third patterning process using a third photomask, a first photoresist pattern 160 is formed to cover the PMOS area 120 and part of the NMOS area 110. Then, an $n^+$-ion implantation 170 is performed to form an $n^+$-polysilicon film 171 in part of the first polysilicon island 130. The $n^+$-polysilicon film 171 serves as a source/drain region. Thus, an NMOS TFT 175 is obtained. It should be noted that, referring to FIG. 1E, misalignment occurs easily in the NMOS area 110 due to use of multiple photomasks, specifically due to the use of a second photomask which is different from the third photomask. This causes the LDD structure 151 (or $n^+$-polysilicon film) to be narrower on one side and wider on the other side. That is, the LDD structure 151 (or $n^-$-polysilicon film) is not symmetrically located in the first polysilicon layer 130 beside the first gate 141, thereby increasing leakage current.

Figure 1D:
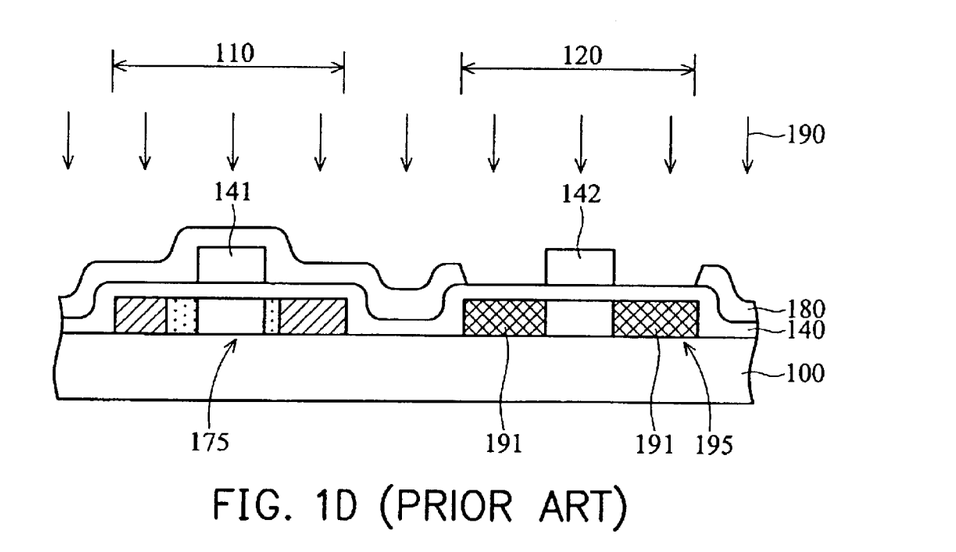
Figure 1E:
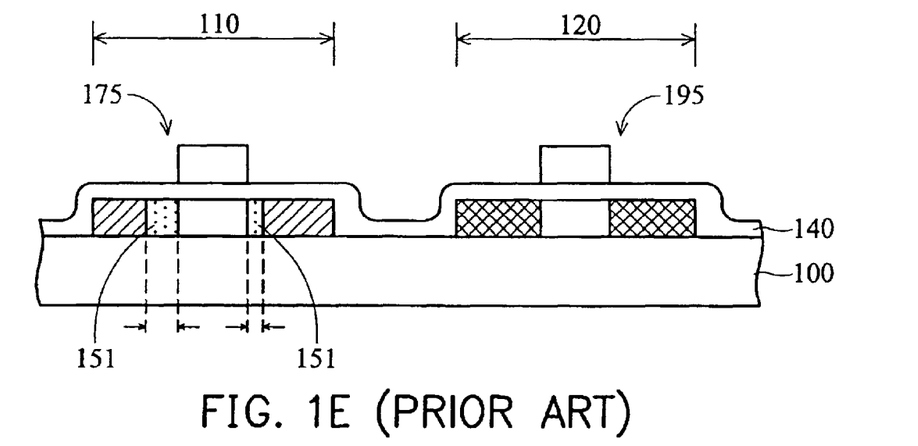

In FIG. 1D, the first photoresist pattern 160 is removed. By performing a fourth patterning process using a fourth photomask, a second photoresist pattern 180 is formed to cover the NMOS area 110. Then, a $p^+$-ion implantation 190 is performed to form a $p^+$-polysilicon film 191 in part of the second polysilicon island 135. The $p^+$-polysilicon film 191 serves as a source/drain region. Thus, a PMOS TFT 195 is obtained. Lastly, the second photoresist pattern 180 is removed, as shown as FIG. 1E.

The conventional method uses two different photomasks to define the gate and the LDD structure, often resulting in misalignment. This causes an asymmetrical LDD structure in the NMOS TFT, thereby increasing leakage current. In addition, the conventional method requires four photomasks, which is complicated and expensive.

SUMMARY OF THE INVENTION

One object of the present invention is to provide a method of forming a CMOS TFT device having a self-aligned and symmetrical LDD structure.

Another object of the present invention is to provide an improved process with fewer photolithography steps for forming an LDD structure in a CMOS TFT device.

In order to achieve these objects, the present invention provides a method of forming a CMOS thin film transistor device. A substrate having an NMOS area, a PMOS area and a circuit area is provided, wherein the NMOS area further comprises a first doped area, a lightly doped area and a first gate area, and the PMOS area further comprises a second doped area and a second gate area. By performing a first patterning process using a first photomask, a first semiconductor island and a second semiconductor island are formed on part of the substrate, wherein the first semiconductor island is located in the NMOS area and the second semiconductor island is located in the PMOS area. A dielectric layer is formed on the first semiconductor island, the second semiconductor island and the substrate. A metal layer is formed on the dielectric layer. By performing a second patterning process using a second photomask, a first photoresist layer is formed on the metal layer located in the lightly doped area, the first gate area, the PMOS area and the circuit area. Using the first photoresist layer as a mask, part of the metal layer is removed to form a first metal layer in the lightly doped area and the first gate area, a second metal layer in the PMOS area and a third metal layer in the circuit area, wherein the third metal layer electrically connects the first metal layer and the second metal layer. Using the first and second metal layers as masks, an $n^+$-ion implantation is performed to form a first source/drain region in the first semiconductor island in the first doped area. By performing a dry etching procedure, part of the first photoresist layer, part of the first metal layer and part of the second metal layer are removed to form a first gate with a symmetrical cone shape, a remaining second metal layer and a remaining first photoresist layer, thereby exposing the dielectric layer in the lightly doped area. Specially, a bottom width of the first gate is narrower than that of the first metal layer and the symmetrically coned shape is gradually thinner from bottom to top. Using the first gate and the remaining second metal layer as masks, an $n^-$-ion implantation is performed to form an LDD (lightly doped drain) region in the first semiconductor layer in the lightly doped area. The remaining first photoresist layer is removed and thus an NMOS element is formed in the NMOS area. By performing a third patterning process using a third photomask, the remaining second metal layer in the second doped area is removed to form a second gate on the dielectric layer in the second gate area. A p⁺-ion implantation is performed to form a second source/drain region in the second semiconductor island in the second doped area and thus a PMOS element is formed in the PMOS area.

The present invention improves on the prior art in that part of the first metal layer and part of the second metal layer are removed to form a first gate with a symmetrical cone shape and a remaining second metal layer, thereby exposing the dielectric layer in the lightly doped area. Specially, the bottom width of the first gate is narrower than that of the first metal layer and the symmetrically coned shape is gradually thinner from bottom to top. Using the first gate and the remaining second metal layer as masks, an n⁻-ion implantation is performed to form a self-aligned and symmetrical LDD region in the first semiconductor layer in the lightly doped area. Thus, the present invention requires only three photomasks to form the CMOS TFT with LDD structure, thereby decreasing costs and ameliorating the disadvantages of the prior art.

BRIEF DESCRIPTION OF THE DRAWINGS

The present invention can be more fully understood by reading the subsequent detailed description in conjunction with the examples and references made to the accompanying drawings, wherein:

FIGS. 2A~11A are perspective top views illustrating a CMOS TFT process according to the present invention; and FIGS. 2B~11B are sectional views taken along line c–c' of FIGS. 2A~11A.

DETAILED DESCRIPTION OF THE INVENTION

FIGS. 2A~11A are perspective top views illustrating a CMOS TFT process according to the present invention. FIGS. 2B~11B are sectional views taken along line c–c' of FIGS. 2A~11A.

Figure 2A:
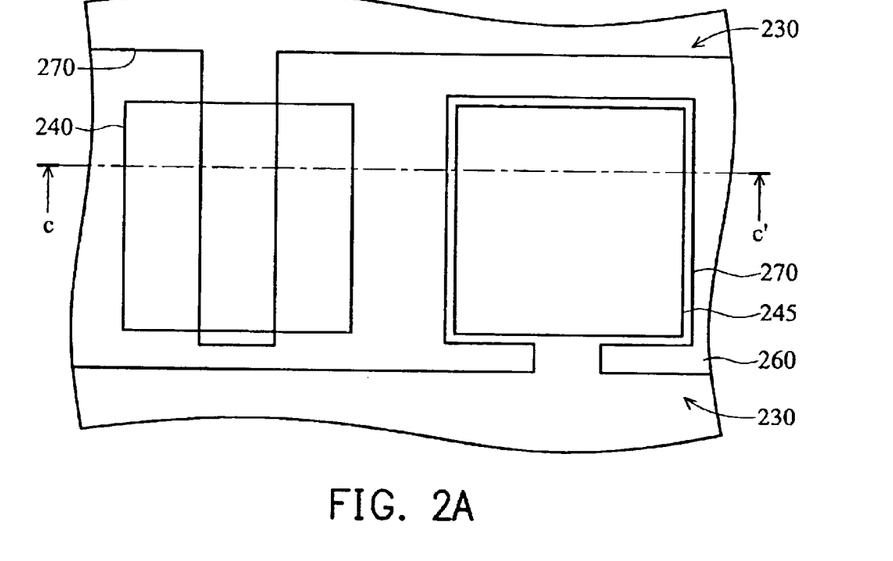
Figure 2B:
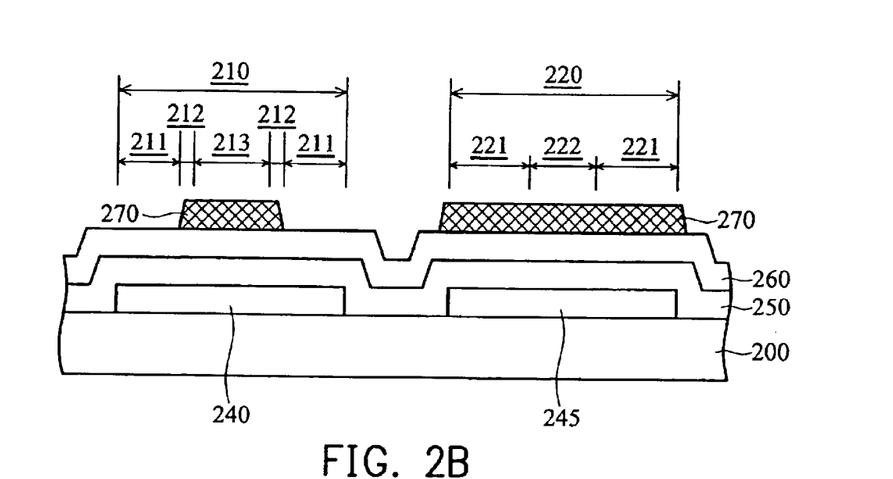

In FIGS. 2A and 2B, a substrate 200 having a predetermined NMOS area 210, a predetermined PMOS area 220 and a predetermined circuit area 230 is provided. The substrate 200 can be a glass or quartz substrate. The NMOS area 210 further comprises a first doped area 211, a lightly doped area 212 and a first gate area 213. The PMOS area 220 further comprises a second doped area 221 and a second gate area 222.

In FIGS. 2A and 2B, a semiconductor layer (not shown) is formed. By performing a first patterning process using a first photomask (or reticle) on the semiconductor layer (not shown), a first semiconductor island 240 and a second semiconductor island 245 are then formed on part of the substrate 200. The first semiconductor island 240 and the second semiconductor island 245 can be polysilicon layers. The first semiconductor island 240 is located in the NMOS area 210 and the second semiconductor island 245 is located in the PMOS area 220. Then, a dielectric layer 250, such as silicon oxide (SiO$_x$) or silicon nitride (SiN$_x$), is formed on the first semiconductor island 240, the second semiconductor island 245 and the substrate 200. The dielectric layer 250 serves as a gate insulating layer.

In FIGS. 2A and 2B, a metal layer 260 is formed on the dielectric layer 250. The metal layer 260 can be a molybdenum (Mo) layer. By performing a second patterning process using a second photomask, a first photoresist layer 270 is formed on the metal layer 260 located in the lightly doped area 212, the first gate area 213, the PMOS area 220 and the circuit area 230.

Figure 3A:
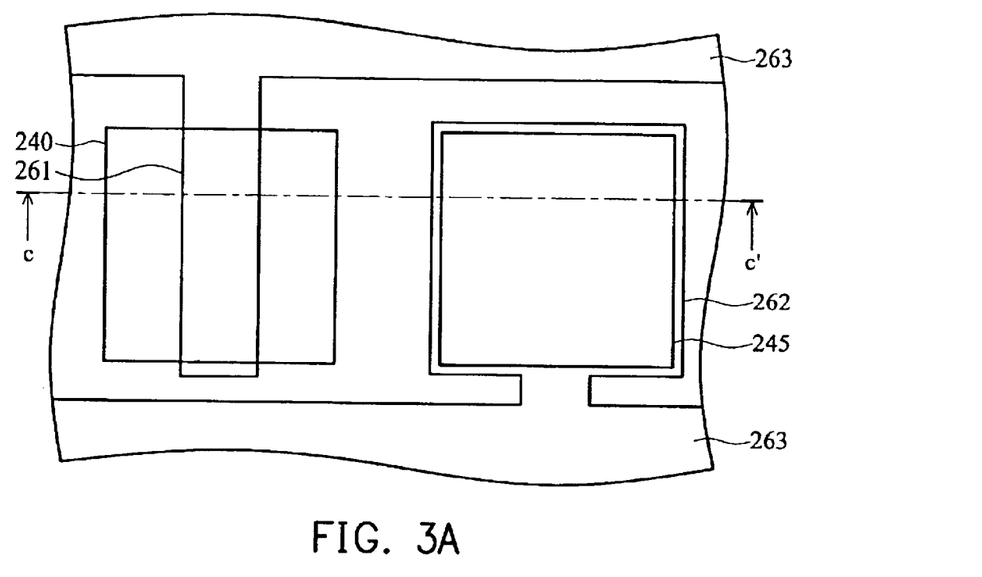
Figure 3B:
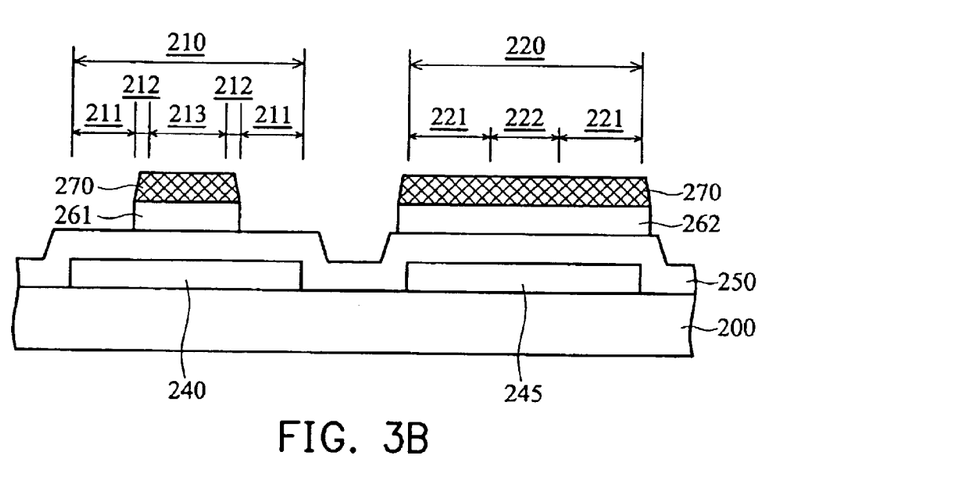

In FIGS. 3A and 3B, using the first photoresist layer 270 as a mask, part of the metal layer 260 is removed to form a first metal layer 261 in the lightly doped area 212 and the first gate area 213, a second metal layer 262 in the PMOS area 220 and a third metal layer 263 in the circuit area 230. The method of removing part of the metal layer 260 can be dry or wet etching, preferably, Cl$_2$ is used as an etching gas for dry etching. The third metal layer 263 electrically connects the first metal layer 261 and the second metal layer 262, as shown as FIG. 3A. In FIG. 3A, the first photoresist layer 270 is not shown.

Figure 4A:
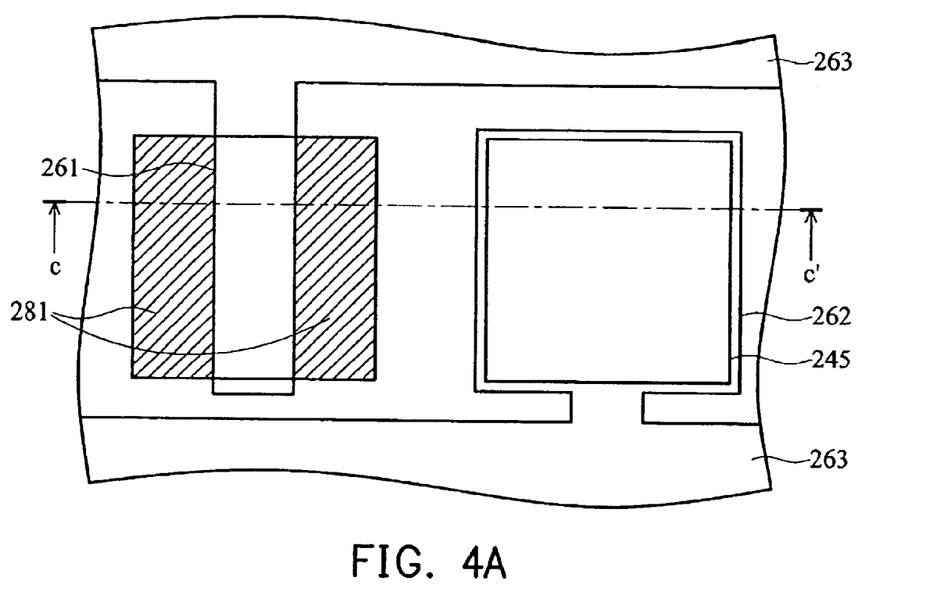
Figure 4B:
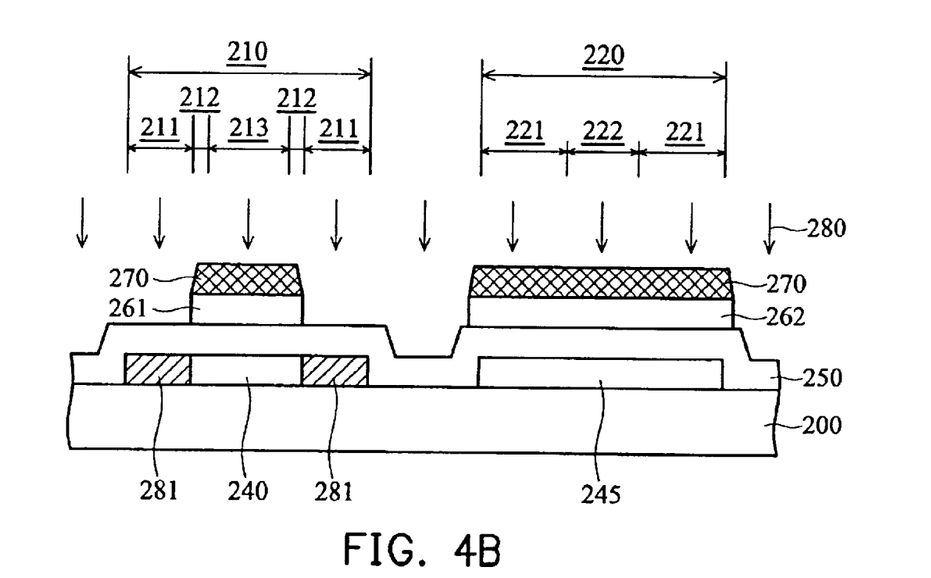

In FIGS. 4A and 4B, using the first metal layer 261 and the second metal layer 262 as masks, an n⁺-ion implantation 280 is performed to form a first source/drain region 281, such as an n⁺-polysilicon film, in the first semiconductor island 240 in the first doped area 211. The n⁺-ions of the implantation 280 can be P⁺ or As⁺ ions. For example, the dose of the n⁺-ions is about 1E15 atom/cm². In FIG. 4A, the first photoresist layer 270 is not shown.

Figure 5A:
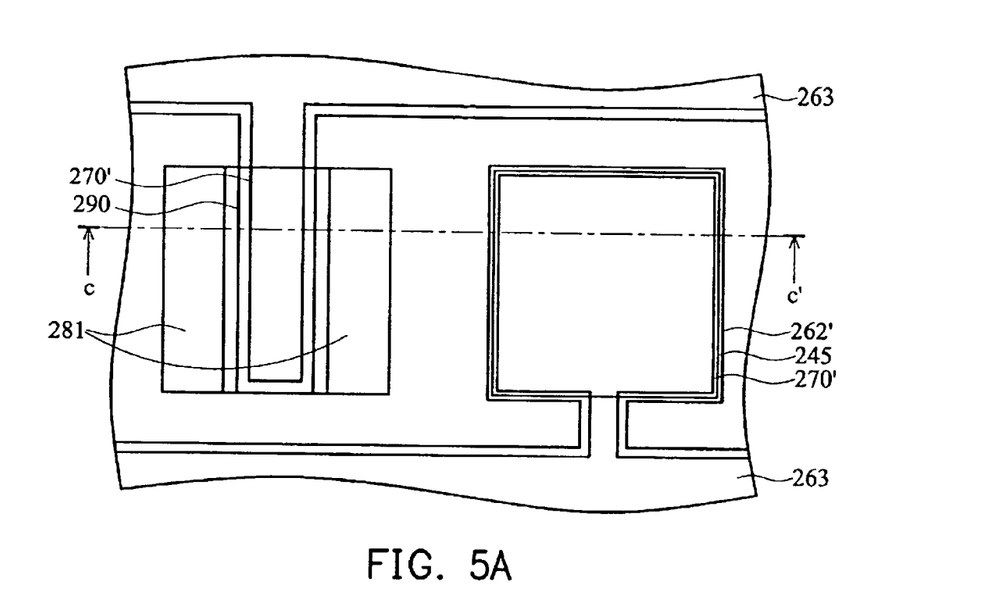
Figure 5B:
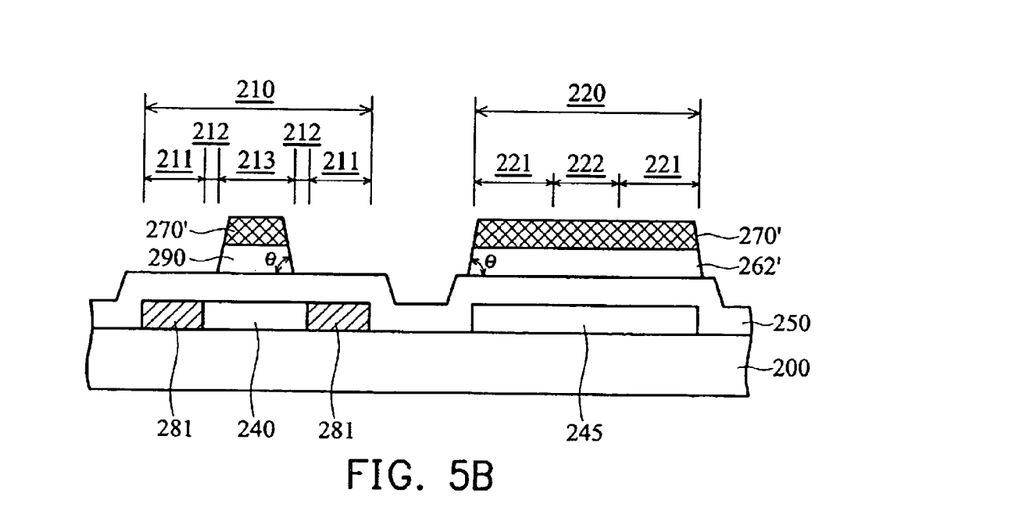

In FIGS. 5A and 5B, a dry etching procedure is performed to uniformly remove part of the first photoresist layer 270, part of the first metal layer 261 and part of the second metal layer 262, thereby forming a first gate 290 with a symmetrical cone shape in the first gate area 213, a remaining second metal layer 262' in the PMOS area 220 and a remaining first photoresist layer 270' in the PMOS area 220 and exposing the dielectric layer 250 in the lightly doped area 212. It should be noted that the bottom width of the first gate 290 is narrower than that of the first metal layer 261, and the symmetrically coned shape is gradually thinner from bottom to top. For example, an included angle θ at the bottom of the symmetrically coned shape (290) is less than 45°, as shown in FIG. 5B. In this embodiment, the etching gas of the dry etching procedure can be Cl$_2$ and O$_2$, wherein an etching selectivity of the first photoresist layer 270' to the metal layer 260 (e.g. Mo layer) ranges from 1 to ¼.

Figure 6A:
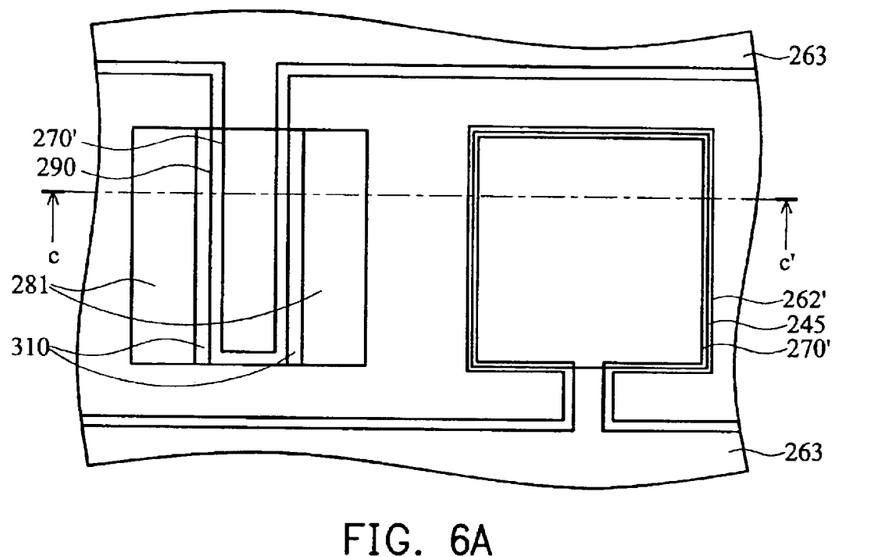
Figure 6B:
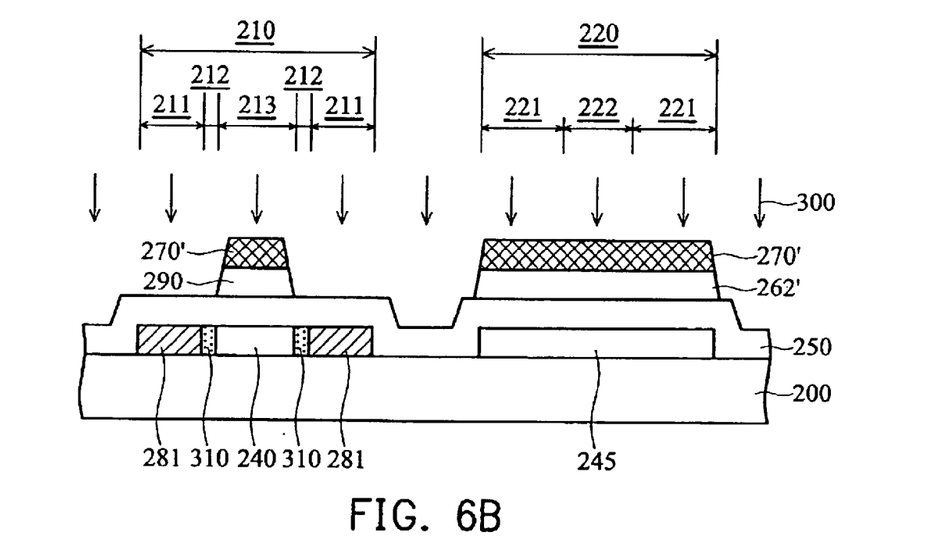

In FIGS. 6A and 6B, using the first gate 290 and the remaining second metal layer 262' as masks, an n⁻-ion implantation 300 is performed to form a self-aligned LDD (lightly doped drain) region 310 in the first semiconductor layer 240 in the lightly doped area 212. The n⁻-ions of the implantation 300 can be P⁺ or As⁺ ions. For example, the dose of the n⁻-ions is about 1E13 atom/cm².

It should be noted that, referring to FIG. 6B, the two sides of the first gate 290 have a symmetrical slope due to the above-mentioned uniform dry etching. Thus, the present method can easily form a self-aligned and symmetrical LDD region 310 in the first semiconductor island 240 located below the two sides of the first gate 290.

Figure 7A:
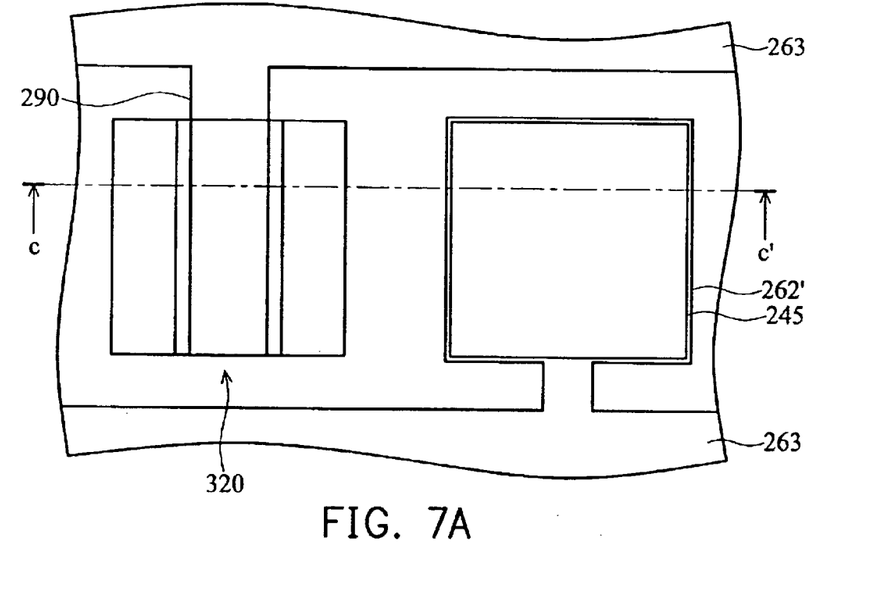
Figure 7B:
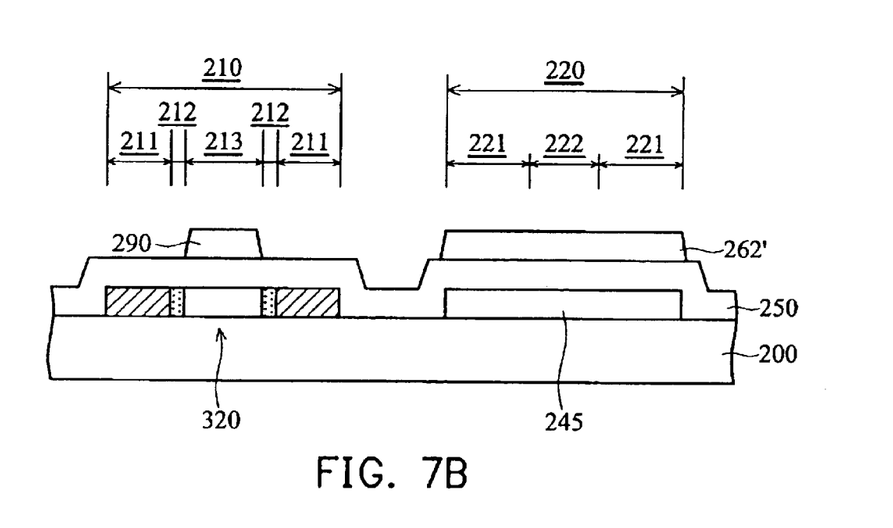

In FIGS. 7A and 7B, the remaining first photoresist layer 270' is then removed. Thus, an NMOS element 320 is obtained in the NMOS area 210.

Figure 8A:
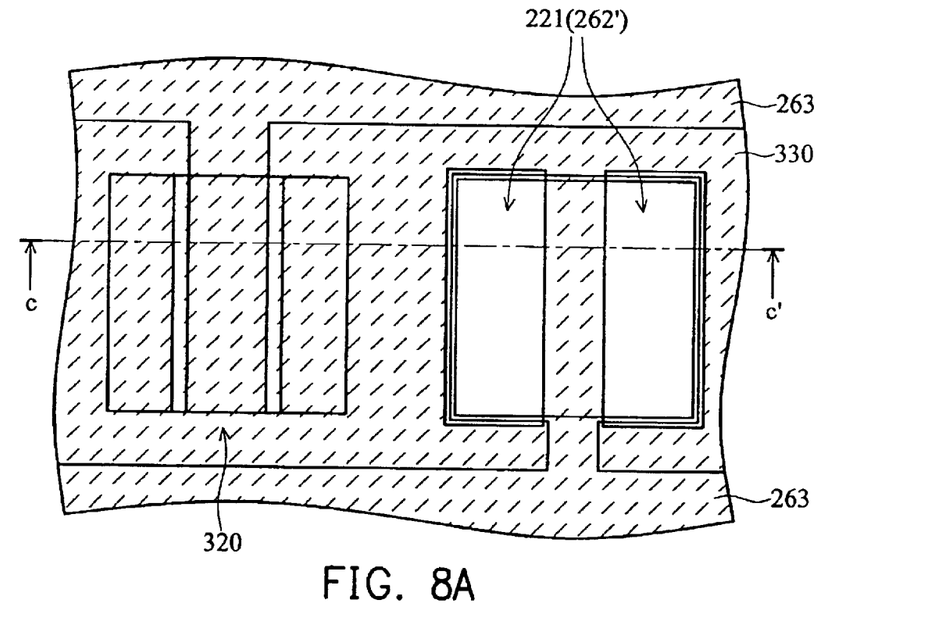
Figure 8B:
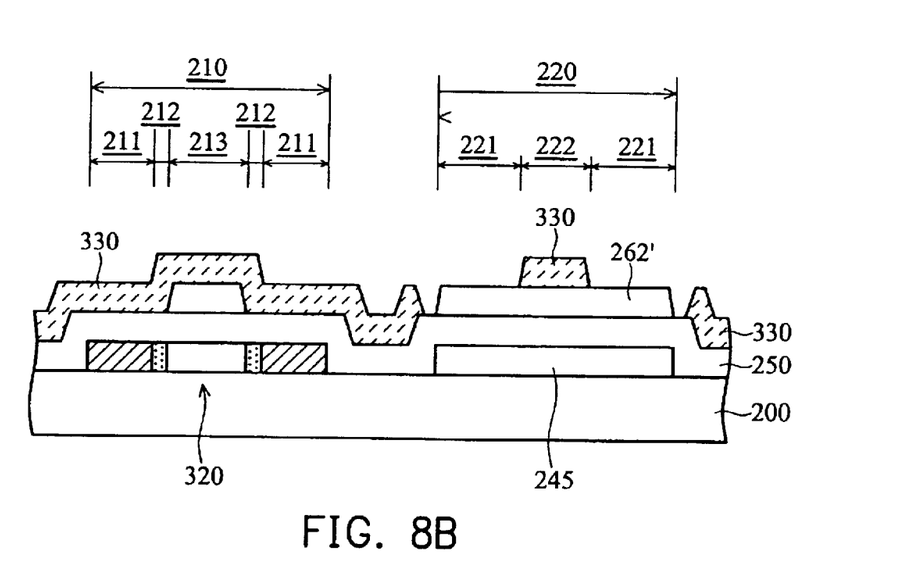

Next, referring to FIGS. 8A and 8B, by performing the third patterning process using the third photomask, a second photoresist layer 330 is formed to cover the NMOS area 221, the circuit area 230 and the second gate area 222. That is, the second photoresist layer 330 only exposes the second doped area 221. In order to thoroughly remove the remaining second metal layer 262' in the second doped area 221, both sides of the remaining second metal layer 262' should be exposed in an opening of the second photoresist layer 330.

Figure 9A:
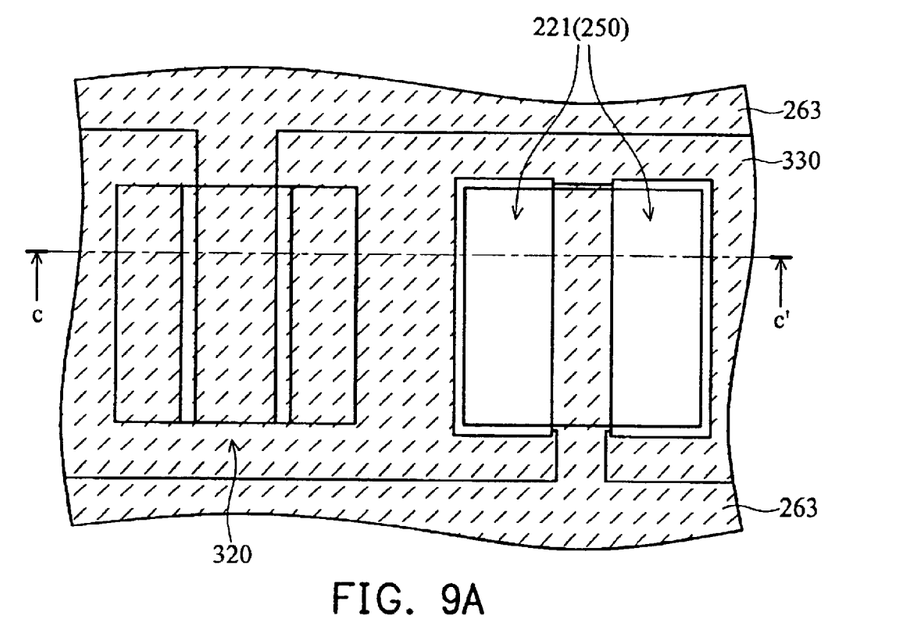
Figure 9B:
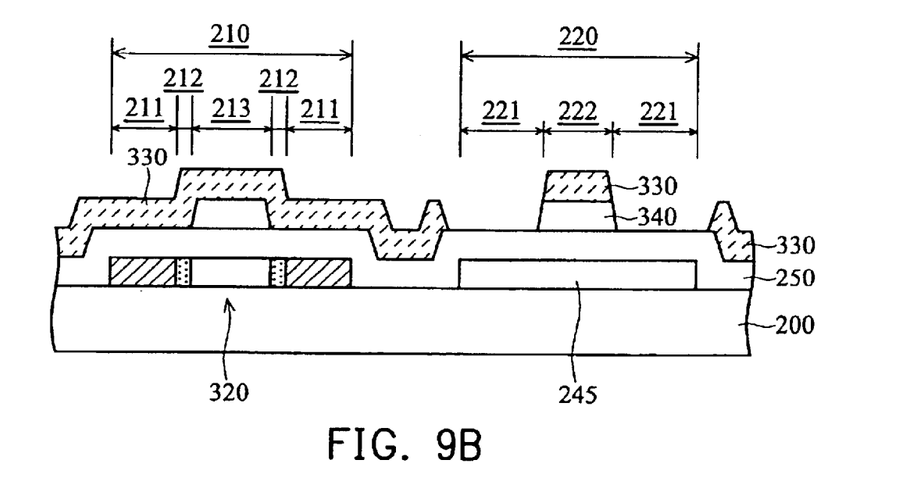

In FIGS. 9A and 9B, using the second photoresist layer 330 as a mask, the remaining second metal layer 262' in the second doped area 221 is removed to form a second gate 340 on the dielectric layer 250 in the second gate area 222. The method of removing the remaining second metal layer 262' can be wet or dry etching. Preferably dry etching is performed with $Cl_2$ as the etching gas.

Figure 10A:
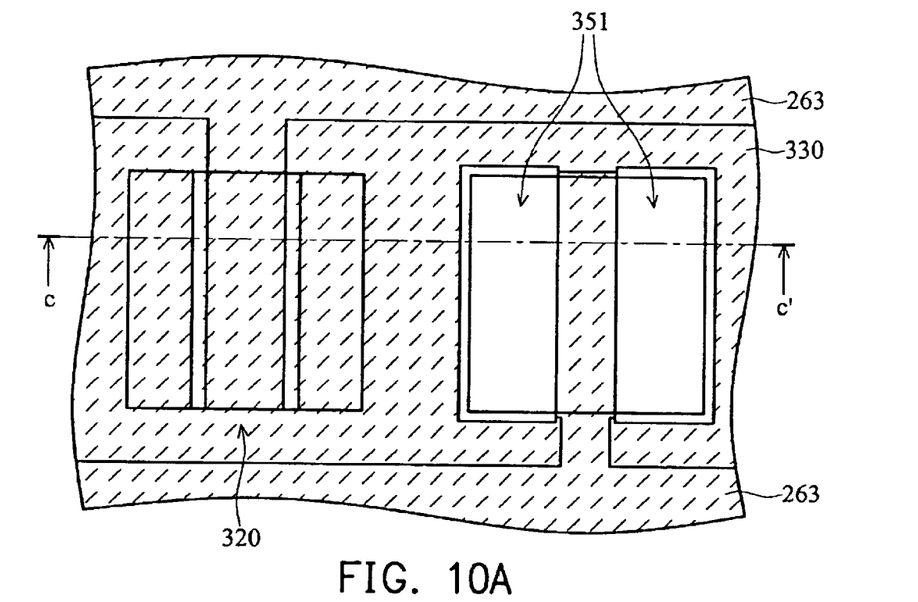
Figure 10B:
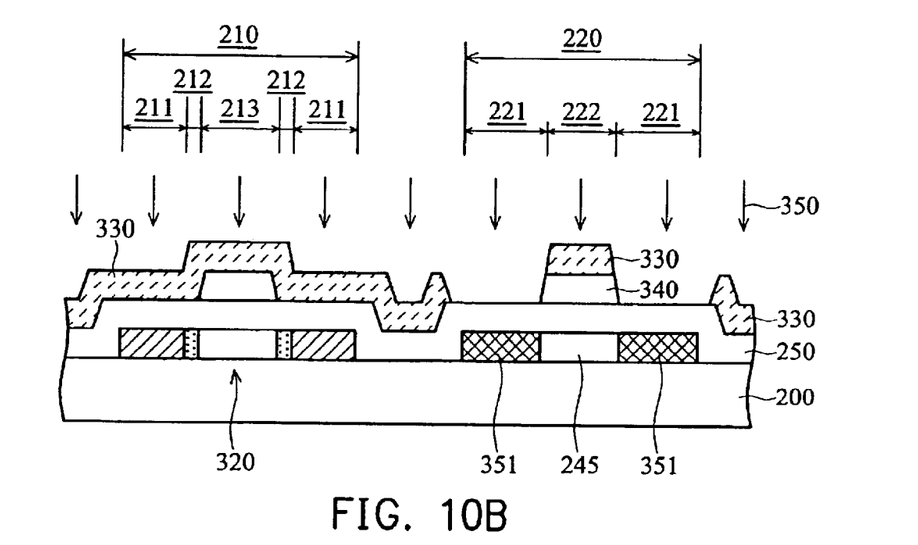

In FIGS. 10A and 10B, using the second photoresist layer 330 and the second gate 340 as masks, the $p^+$-ion implantation 350 is performed to form the second source/drain region 351 in the second semiconductor island 245 in the second doped area 221. Thus, a PMOS element 360 is obtained in the PMOS area. The $p^+$-ions of the implantation 350 can be $B^+$ ions.

Figure 11A:
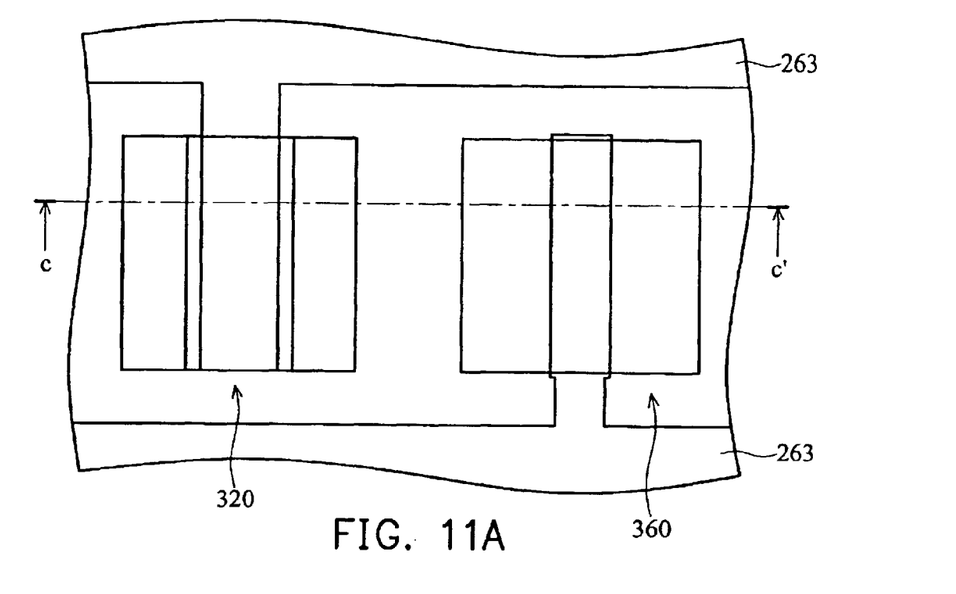
Figure 11B:
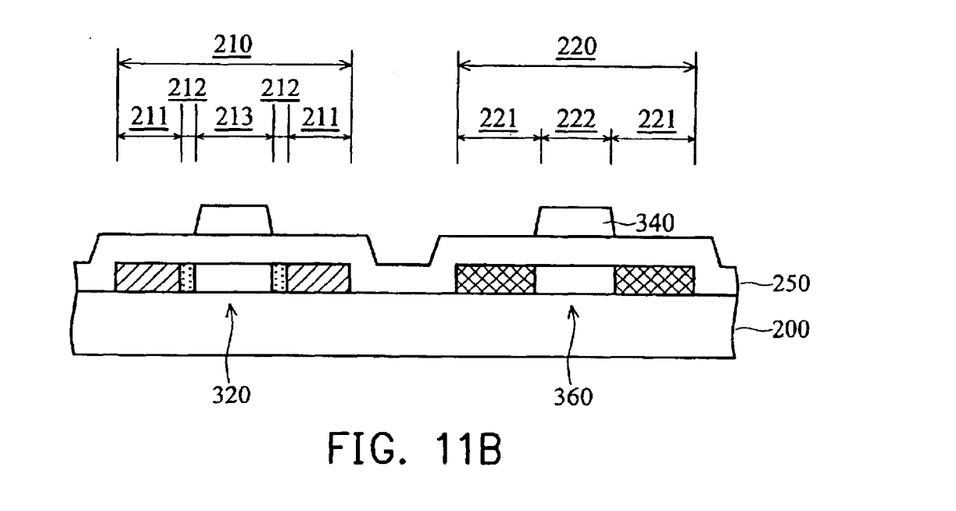

Lastly, referring to FIGS. 11A and 11B, the second photoresist layer 330 is removed. Thus, a CMOS TFT device comprising the NMOS element 320 and the PMOS element 360 is obtained.

The present invention provides a method of forming a CMOS TFT device with an LDD structure. The present method uses only three photolithography steps to form the CMOS TFT device. A feature of the method is that the first metal layer is removed to form a first gate with a symmetrical cone shape, thereby exposing the dielectric layer in the lightly doped area. Specifically, the bottom width of the first gate is narrower than that of the first metal layer and the symmetrically coned shape is gradually thinner from bottom to top. Using the first gate and the remaining second metal layer as masks, an $n^-$-ion implantation is performed to form a self-aligned and symmetrical LDD region in the first semiconductor layer without additional photolithography steps. Thus, the present invention requires only three photomasks to fabricate the CMOS TFT with symmetrical LDD structure, thereby reducing leakage current and manufacturing cost and ameliorating the disadvantages of the prior art.

While the present invention has been described by way of examples and in terms of the above, it is to be understood that the present invention is not limited to the disclosed embodiments. Instead, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of forming a CMOS thin film transistor device on a substrate having an NMOS area, a PMOS area and a circuit area, the NMOS area having a first doped area, a lightly doped area and a first gate area, and the PMOS area having a second doped area and a second gate area, the method comprising the steps of:

(a) forming a semiconductor layer on the substrate;
   (b) performing a first patterning process using a first photomask on the semiconductor layer to form a first semiconductor island and a second semiconductor island on part of the substrate, wherein the first semiconductor island is located in the NMOS area and the second semiconductor island is located in the PMOS area;
   (c) forming a dielectric layer on the first semiconductor island, the second semiconductor island and the substrate;
   (d) forming a metal layer on the dielectric layer;
   (e) performing a second patterning process using a second photomask to form a first photoresist layer on the metal layer located in the lightly doped area, the first gate area, the PMOS area and the circuit area;
   (f) using the first photoresist layer as a mask, removing part of the metal layer to form a first metal layer in the lightly doped area and the first gate area, a second metal layer in the PMOS area and a third metal layer in the circuit area, wherein the third metal layer electrically connects the first metal layer and the second metal layer;
   (g) using the first and the second metal layers as masks, performing an $n^+$-ion implantation to form a first source/drain region in the first semiconductor island in the first doped area;
   (h) performing a dry etching procedure to remove part of the first photoresist layer, part of the first metal layer and part of the second metal layer, thus forming a first gate with a symmetrical cone shape, a remaining second metal layer and a remaining first photoresist layer, and exposing the dielectric layer in the lightly doped area, wherein a bottom width of the first gate is narrower than that of the first metal layer, and the symmetrically coned shape is gradually thinner from bottom to top;
   (i) using the first gate and the remaining second metal layer as masks, performing an $n^-$-ion implantation to form an LDD (lightly doped drain) region in the first semiconductor layer in the lightly doped area;
   (j) removing the remaining first photoresist layer and thus forming an NMOS element in the NMOS area;
   (k) performing a third patterning process using a third photomask to remove the remaining second metal layer in the second doped area, thus forming a second gate on the dielectric layer in the second gate area; and
   (l) performing a $p^+$-ion implantation to form a second source/drain region in the second semiconductor island in the second doped area, thus forming a PMOS element in the PMOS area.

2. The method according to claim 1, wherein step (k) further comprises the steps of:
   (k1) performing the third patterning process using the third photomask to form a second photoresist layer cover the NMOS area, the circuit area and the second gate area; and
   (k2) using the second photoresist layer as a mask, removing the remaining second metal layer in the second doped area to form the second gate on the dielectric layer in the second gate area.

3. The method according to claim 2, wherein step (l) further comprises the step of: (l1) using the second photoresist layer and the second gate as masks, performing the $p^+$-ion implantation to form the second source/drain region in the second semiconductor island in the second doped area and thus forming the PMOS element in the PMOS area.

4. The method according to claim 1, wherein the substrate is a glass substrate.

5. The method according to claim 1, wherein the first and the second semiconductor islands comprise silicon.

6. The method according to claim 1, wherein the dielectric layer is a $SiO_x$ layer.

7. The method according to claim 1, wherein the metal layer comprises Mo.

8. The method according to claim 1, wherein part of the metal layer is removed by dry or wet etching.

9. The method according to claim 1, wherein an included angle at the bottom of the symmetrically coned shape is less than 45°.

10. The method according to claim 1, wherein an etching selectivity of the first photoresist layer to the metal layer ranges from 1 to ¼.

11. A method of forming a CMOS thin film transistor device on a glass substrate having an NMOS area, a PMOS area and a circuit area, the NMOS area having a first doped area, a lightly doped area and a first gate area, and the PMOS area having a second doped area and a second gate area, the method comprising the steps of:

(a) forming a semiconductor layer on the substrate;

(b) performing a first patterning process using a first photomask on the semiconductor layer to form a first semiconductor island and a second semiconductor island on part of the glass substrate, wherein the first semiconductor island is located in the NMOS area and the second semiconductor island is located in the PMOS area;

(c) forming a silicon oxide ($SiO_x$) layer on the first semiconductor island, the second semiconductor island and the glass substrate;

(d) forming a molybdenum (Mo) layer on the silicon oxide layer;

(e) performing a second patterning process using a second photomask to form a first photoresist layer on the Mo layer located in the lightly doped area, the first gate area, the PMOS area and the circuit area;

(f) using the first photoresist layer as a mask, removing part of the Mo layer to form a first Mo layer in the lightly doped area and the first gate area, a second Mo layer in the PMOS area and a third Mo layer in the circuit area, wherein the third Mo layer electrically connects the first Mo layer and the second Mo layer;

(g) using the first and the second Mo layers as masks, performing an $n^+$-ion implantation to form a first source/drain region in the first semiconductor island in the first doped area;

(h) performing a dry etching procedure to remove part of the first photoresist layer, part of the first Mo layer and part of the second Mo layer, thus forming a first gate with a symmetrical cone shape, a remaining second Mo layer and a remaining first photoresist layer, and exposing the silicon oxide layer in the lightly doped area, wherein a bottom width of the first gate is narrower than that of the first metal layer, and the symmetrically coned shape is gradually thinner from bottom to top;

(i) using the first gate and the remaining second Mo layer as masks, performing an $n^-$-ions implantation to form an LDD (lightly doped drain) region in the first semiconductor layer in the lightly doped area;

(j) removing the remaining first photoresist layer and thus forming an NMOS element in the NMOS area;

(k) performing a third patterning process using a third photomask to remove the remaining second Mo layer in the second doped area to form a second gate on the silicon oxide layer in the second gate area; and (l) performing a $p^+$-ion implantation to form a second source/drain region in the second semiconductor island in the second doped area, thus forming a PMOS element in the PMOS area.

12. The method according to claim 11, wherein step (k) further comprises the steps of:

(k1) performing the third patterning process using the third photomask to form a second photoresist layer cover the NMOS area, the circuit area and the second gate area; and (k2) using the second photoresist layer as a mask, removing the remaining second Mo layer in the second doped area to form the second gate on the silicon oxide layer in the second gate area.

13. The method according to claim 12, wherein step (l) further comprises the step of:

(l1) using the second photoresist layer and the second gate as masks, performing the $p^+$-ion implantation to form the second source/drain region in the second semiconductor island in the second doped area and thus forming the PMOS element in the FMOS area.

14. The method according to claim 11, wherein the first and the second semiconductor islands are polysilicon layers.

15. The method according to claim 11, wherein part of the metal layer is removed by dry or wet etching.

16. The method according to claim 11, wherein an included angle at the bottom of the symmetrical cone shape is less than 45°.

17. The method according to claim 11, wherein an etching selectivity of the first photoresist layer to the metal layer ranges from 1 to ¼.

18. A method of forming a CMOS thin film transistor device on a substrate having at least one NMOS area and at least one PMOS area, the NMOS area having a first doped area, a lightly doped area and a first gate area, and the PMOS area having a second doped area and a second gate area, the method comprising the steps of:

forming a semiconductor layer on the substrate;

performing a first patterning process using a first photomask on the semiconductor layer to form a first semiconductor island and a second semiconductor island on part of the substrate, wherein the first semiconductor island is located in the NMOS area and the second semiconductor island is located in the PMOS area;

forming a dielectric layer on the first semiconductor island, the second semiconductor island and the substrate;

forming a metal layer on the dielectric layer;

performing a second patterning process using a second photomask to form a first photoresist layer on the metal layer located in the lightly doped area, the first gate area and the PMOS area;

using the first photoresist layer as a mask, removing part of the metal layer to form a first metal layer in the lightly doped area and the first gate area and a second metal layer in the PMOS area;

using the first and the second metal layers as masks, performing an $n^+$-ion implantation to form a first source/drain region in the first semiconductor island in the first doped area;

performing a dry etching procedure to remove part of the first photoresist layer, part of the first metal layer and part of the second metal layer, thus forming a first gate with a symmetrical cone shape, a remaining second metal layer and a remaining first photoresist layer, and exposing the dielectric layer in the lightly doped area, wherein a bottom width of the first gate is narrower than that of the first metal layer, and the symmetrically coned shape is gradually thinner from bottom to top;

using the first gate and the remaining second metal layer as masks, performing an $n^-$-ion implantation to form an LDD (lightly doped drain) region in the first semiconductor layer in the lightly doped area;

removing the remaining first photoresist layer and thus forming an NMOS element in the NMOS area;

performing a third patterning process using a third photomask to remove the remaining second metal layer in the second doped area, thus forming a second gate on the dielectric layer in the second gate area; and performing a $p^+$-ion implantation to form a second source/drain region in the second semiconductor island in the second doped area, thus forming a PMOS element in the PMOS area.

19. The method according to claim 18, wherein an included angle at the bottom of the symmetrically coned shape is less than 45°.

20. The method according to claim 19, wherein an etching selectivity of the first photoresist layer to the metal layer ranges from 1 to ¼.

* * * * *